(12) United States Patent
Yamaguchi et al.

(10) Patent No.: US 9,484,608 B2
(45) Date of Patent: Nov. 1, 2016

(54) SWITCH MODULE

(71) Applicant: Murata Manufacturing Co., Ltd., Nagaokakyo-shi, Kyoto-fu (JP)

(72) Inventors: Yukiya Yamaguchi, Nagaokakyo (JP); Takanori Uejima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 262 days.

(21) Appl. No.: 13/872,311

(22) Filed: Apr. 29, 2013

(65) Prior Publication Data

US 2013/0314170 A1   Nov. 28, 2013

(30) Foreign Application Priority Data

May 24, 2012   (JP) ................................. 2012-118473

(51) Int. Cl.
| | |
|---|---|
| *H04M 1/02* | (2006.01) |
| *H03H 9/05* | (2006.01) |
| *H01P 1/10* | (2006.01) |
| *H01P 11/00* | (2006.01) |
| *H01L 23/538* | (2006.01) |
| *H01L 23/66* | (2006.01) |
| *H01L 25/16* | (2006.01) |
| *H03H 7/01* | (2006.01) |
| *H01L 23/50* | (2006.01) |

(52) U.S. Cl.
CPC ............ *H01P 1/10* (2013.01); *H01L 23/5386* (2013.01); *H01L 23/66* (2013.01); *H01L 25/16* (2013.01); *H01P 11/003* (2013.01); *H04M 1/0222* (2013.01); *H01L 23/50* (2013.01); *H01L 2224/16225* (2013.01); *H01L 2924/1531* (2013.01); *H01L 2924/19105* (2013.01); *H03H 7/0138* (2013.01)

(58) Field of Classification Search
USPC ......... 327/564–565, 551–559; 332/103, 303; 333/101, 132–133, 238
See application file for complete search history.

(56) References Cited

U.S. PATENT DOCUMENTS

| | | | | |
|---|---|---|---|---|
| 7,596,357 | B2 * | 9/2009 | Nakamata et al. | ............. 455/78 |
| 8,252,483 | B2 * | 8/2012 | Iino et al. | ..................... 429/519 |
| 8,698,574 | B2 * | 4/2014 | Sugiura et al. | ............... 333/101 |
| 2004/0217914 | A1 | 11/2004 | Yamashita et al. | |
| 2005/0221769 | A1 | 10/2005 | Kemmochi et al. | |
| 2008/0217515 | A1 * | 9/2008 | Fujii | ........................ G01J 1/02 250/208.2 |

(Continued)

FOREIGN PATENT DOCUMENTS

| | | |
|---|---|---|
| CN | 101401317 A | 4/2009 |
| CN | 101902241 A | 12/2010 |
| JP | 2002-064301 A | 2/2002 |

(Continued)

OTHER PUBLICATIONS

Official Communication issued in corresponding Chinese Patent Application No. 201310195366.4, mailed on Nov. 15, 2014.

*Primary Examiner* — Dinh T Le

(74) *Attorney, Agent, or Firm* — Keating & Bennett, LLP

(57) ABSTRACT

A switch module includes a plurality of mounting electrodes for external connection provided on a peripheral portion of one main surface of a wiring substrate. The plurality of mounting electrodes includes a common electrode, a plurality of RF signal electrodes, a control electrode, and a power supply electrode. At least one of the power supply electrode and the control electrode is arranged between the RF signal electrodes.

15 Claims, 7 Drawing Sheets

(56) References Cited

U.S. PATENT DOCUMENTS

2010/0157860 A1 6/2010 Hagiwara et al.
2010/0304693 A1 12/2010 Uejima et al.

FOREIGN PATENT DOCUMENTS

| JP | 2004-253953 A | 9/2004 |
| JP | 2011-097557 A | 5/2011 |

* cited by examiner

SWITCH MODULE

BACKGROUND OF THE INVENTION

1. Field of the Invention

The present invention relates to multi-band switch modules which can transmit and receive signals in a plurality of frequency bands and which are mounted in portable terminal apparatuses.

2. Description of the Related Art

In recent years, in the area of cellular phones, smooth voice communication or data transmission/reception has become difficult when only a single frequency band is used due to the increasing number of users. Thus, cellular phones have been produced to support multiple bands so that a single cellular phone can handle a plurality of frequency bands.

In this case, one method of supporting a plurality of frequency bands is to provide individual circuits for the respective frequency bands in a cellular phone. However, since this method makes it difficult to reduce the size of a cellular phone, it is preferable to form the circuits such that a single component for a common function is shared by all the circuits. Thus, a technique has been proposed in which all signals in different frequency bands are transmitted and received together using a common antenna and are separated for each frequency band by a switch module including a demultiplexer circuit and a switch circuit.

In such a switch module, a plurality of mounting electrodes is provided on, for example, one main surface of a wiring substrate, on which the switch module is provided, for input/output of a signal from/to a mother substrate. Since a reduction in the size of a switch module is required in accordance with the reduction in the size of cellular phones, there is a tendency for the area of the main surface of the wiring substrate to be decreased. In this case, the distance between the mounting electrodes needs to be decreased, such that an influence from mutual interference among signals, i.e., mutual leakage of signals among the mounting electrodes used for input/output of RF signals, is increased, which may cause a failure, such as a communication failure.

Thus, referring to FIG. 10, a switch module 200 has been proposed in which, among a plurality of mounting electrodes 202 provided on a wiring substrate 201, the mounting electrodes 202 used for input/output of RF signals are arranged so as to be sandwiched between ground electrodes 203 (refer to, for example, paragraph 0051 and FIG. 3 of Japanese Unexamined Patent Application Publication No. 2002-64301).

The switch module 200, which is a module that supports three different communication systems, includes a demultiplexer and a plurality of switch circuits for demultiplexing signals of the three transmission/reception systems and a plurality of low pass filters provided in transmission/reception paths. A diode 204, a chip capacitor 205, and a chip resistor 206, which are components of the circuits, are mounted on the wiring substrate 201, and a plurality of the mounting electrodes 202 used for input/output of the RF signals are provided along the periphery of the wiring substrate 201. Each of the plurality of the mounting electrodes 202 is arranged so as to be sandwiched between the ground electrodes 203.

In this manner, the RF signals leaking from the mounting electrodes 202 used for input/output of the RF signals are conducted to the ground electrodes 203 and, thus, mutual interference among the RF signals at the mounting electrodes 202 is suppressed, such that isolation characteristics of the mounting electrodes 202 can be improved.

However, due to further demand for a reduction in the size of the switch module 200, it has become difficult to ensure a space to provide the ground electrodes 203 between the mounting electrodes 202 used for input/output of the RF signals whose mutual interference is to be suppressed. Methods of ensuring a space for arranging the ground electrodes 203 include reducing the areas in which the mounting electrodes 202 are provided and employing a smaller spacing between the mounting electrodes 202. However, since mounting of the switch module 200 becomes difficult and short circuiting between the mounting electrodes 202 may occur at the time of mounting, a technique, other than the above-mentioned methods, of suppressing mutual interference between the RF signals at the mounting electrodes 202 and achieving a reduction in the size of the switch module 200 has been desired.

SUMMARY OF THE INVENTION

In view of the above-described problems, preferred embodiments of the present invention provide a small switch module that significantly reduces or prevents mutual signal interference between the mounting electrodes used for input/output of RF signals.

A switch module according to a preferred embodiment of the present invention includes an antenna common terminal, a plurality of RF signal terminals, a control terminal, a power supply terminal, a switch circuit selectively connecting, through switching, one of the RF signal terminals to the antenna common terminal based on a control signal input to the control terminal, a wiring substrate on which the switch circuit is provided. The wiring substrate includes a plurality of mounting electrodes for external connection provided on a peripheral portion of one main surface of the wiring substrate. The plurality of mounting electrodes includes a common electrode connected to the antenna common terminal, a plurality of RF signal electrodes respectively connected to the RF signal terminals, a control electrode connected to the control terminal, and a power supply electrode connected to the power supply terminal. At least one of the power supply electrode and the control electrode is arranged between the RF signal electrodes.

By arranging at least one of the power supply electrode and the control electrode between the RF signal electrodes, a distance between the RF signal electrodes between which the power supply electrode or the control electrode is sandwiched is increased and, thus, mutual interference between signals flowing through the two RF signal electrodes is significantly reduced or prevented and isolation characteristics of the two RF signal electrodes are improved.

Further, since a ground electrode need not be provided to prevent mutual interference between signals flowing through the two RF signal electrodes, the number of the mounting electrodes to be provided on the wiring substrate is decreased, resulting in a decrease in the size of the switch module.

At least one of the power supply electrode and the control electrode is preferably arranged between electrodes, among the RF signal electrodes, used for input or output of RF signals whose frequency bands partially overlap. With this configuration, the distance between the RF signal electrodes which are likely to be influenced by the mutual interference between the signals is increased, such that the isolation characteristics of the RF signal electrodes are further improved.

The wiring substrate may preferably be rectangular or substantially rectangular in plan view, and among the plurality of the RF signal electrodes that are used for input or output of two RF signals whose frequency bands partially overlap, the RF signal electrode for one of the two RF signals may preferably be arranged on a side of the wiring substrate opposite a side of the wiring substrate on which the RF signal electrode for the other RF signal is arranged. The power supply electrode and the control electrode may preferably be arranged on sides of the wiring substrate excluding the sides of the wiring substrate on which the RF signal electrodes for the two RF signals are respectively arranged.

With this configuration, the distance between the RF signal electrodes which are likely to be influenced by the mutual interference between the signals is further increased, such that the isolation characteristics of the two RF signal electrodes are further improved.

The RF signal electrodes may preferably include a transmission/reception common electrode. In this case, since there is no need to provide transmission electrodes and reception electrodes separately, the number of the mounting electrodes is decreased, resulting in a decrease in the size of the switch module.

The switch module may preferably further include a ground electrode provided on the one main surface, and the ground electrode may be arranged in an area of the one main surface surrounded by the mounting electrodes. With this configuration, the ground electrodes arranged on the peripheral portions of the wiring substrate can be integrated into this ground electrode in the area surrounded by the mounting electrodes and, thus, the number of the electrodes provided on the one main surface is decreased, resulting in a decrease in the size of the switch module.

Wiring electrodes respectively connecting the RF signal terminals to the RF signal electrodes, a wiring electrode connecting the power supply terminal to the power supply electrode, and a wiring electrode connecting the control terminal to the control electrode may preferably be arranged on the wiring substrate so as not to overlap one another. With this configuration, it is possible to significantly reduce or prevent noise caused by, for example, electromagnetic coupling which is generated between the RF signal wiring lines and the control/power-supply wiring electrodes provided on or within the wiring substrate. As a result, the switch circuit is prevented from malfunctioning.

The RF signal electrodes may preferably be arranged on both sides of the power supply electrode and both sides of the control electrode. With this configuration, the power supply electrode and the control electrode are effectively arranged between the RF signal electrodes and, thus, the isolation characteristics of the RF signal electrodes are further improved.

A configuration may preferably be provided in which the switch circuit is a rectangular or substantially rectangular switch IC in plan view mounted on the other main surface of the wiring substrate, the power supply terminal and the control terminal are arranged along one side of the switch IC in plan view, the RF signal terminals are arranged along sides of the switch IC other than the one side of the switch IC in plan view, the power supply electrode and the control electrode are respectively arranged close to the power supply terminal and the control terminal, and the RF signal electrodes are arranged close to the RF signal terminal.

With this configuration, the lengths of the wiring electrodes respectively connecting the RF signal terminals to the corresponding RF signal electrodes is significantly reduced. Thus, stray capacitance is reduced and degradation of the high-frequency characteristics of the switch module is prevented.

According to various preferred embodiments of the present invention, by arranging at least one of the power supply electrode and the control electrode between the RF signal electrodes, a distance between the RF signal electrodes between which the power supply electrode or the control electrode is sandwiched is increased and, thus, mutual interference between signals flowing through the two RF signal electrodes is significantly reduced or prevented and isolation characteristics of the two RF signal electrodes are improved. Further, since a ground electrode need not be provided to prevent mutual interference between signals flowing through the two RF signal electrodes, the number of the mounting electrodes to be provided on the wiring substrate is decreased, resulting in a decrease in the size of the switch module.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
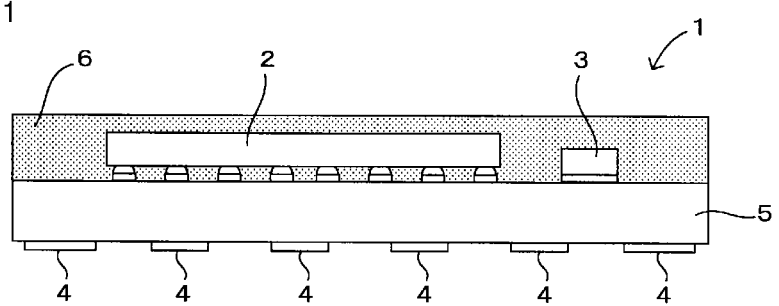
FIG. 1 is a front view of a switch module according to a preferred embodiment of the present invention.
Figure 2:
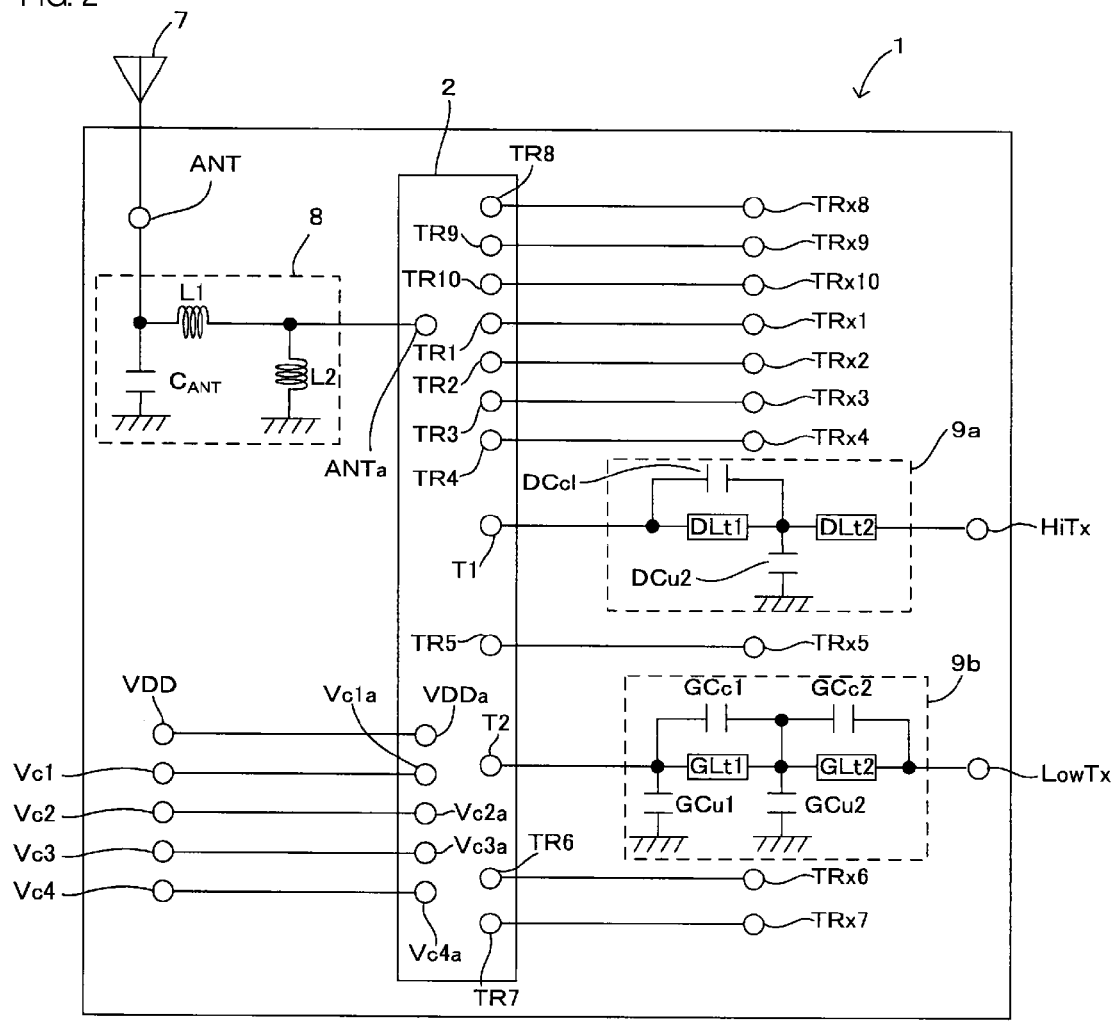
FIG. 2 is a circuit configuration diagram of the switch module illustrated in FIG. 1.
Figure 3:
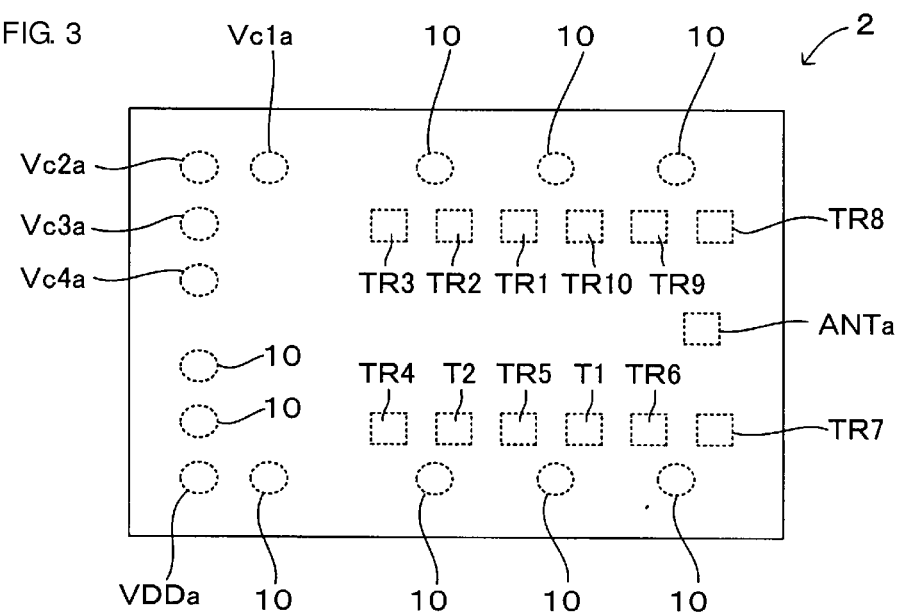
FIG. 3 is a terminal arrangement diagram of a switch IC illustrated in FIG. 1.
Figure 4:
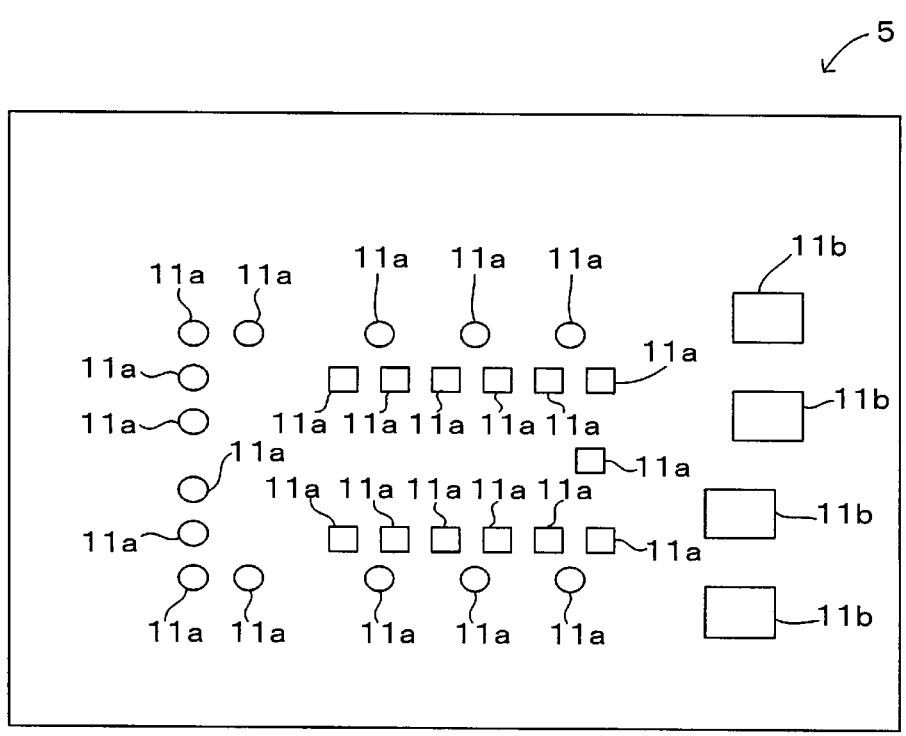
FIG. 4 is a plan view of the wiring substrate of the switch module illustrated in FIG. 1.
Figure 5:
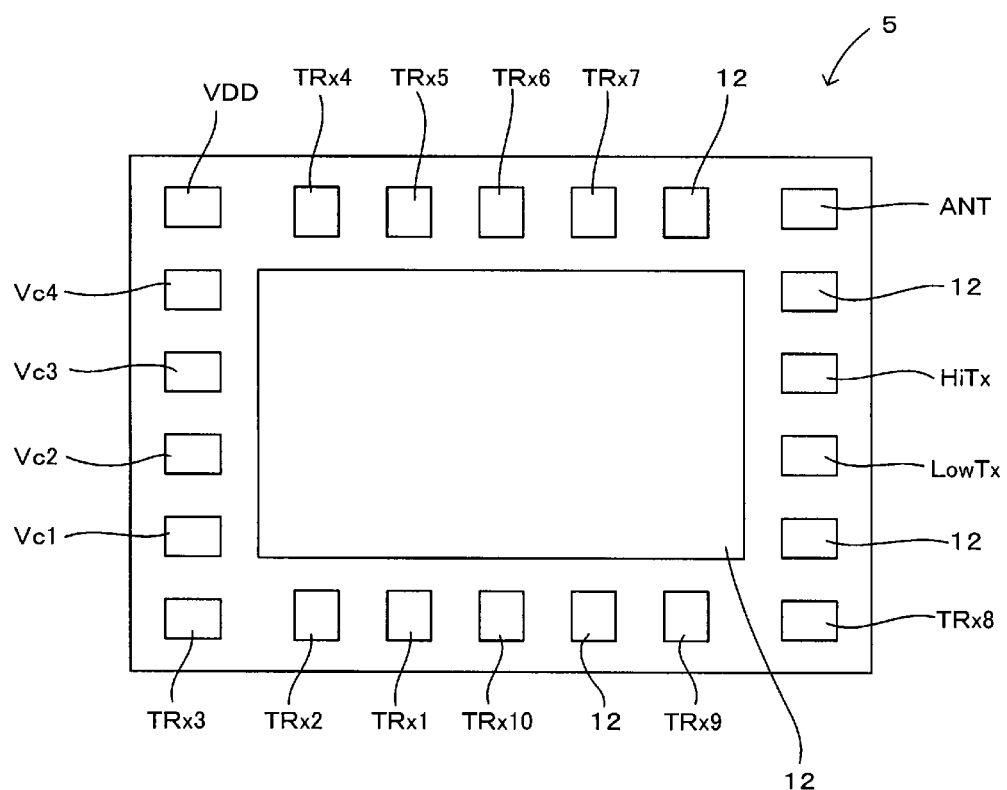
FIG. 5 is a bottom view of the wiring substrate of the switch module illustrated in FIG. 1.
Figure 6:
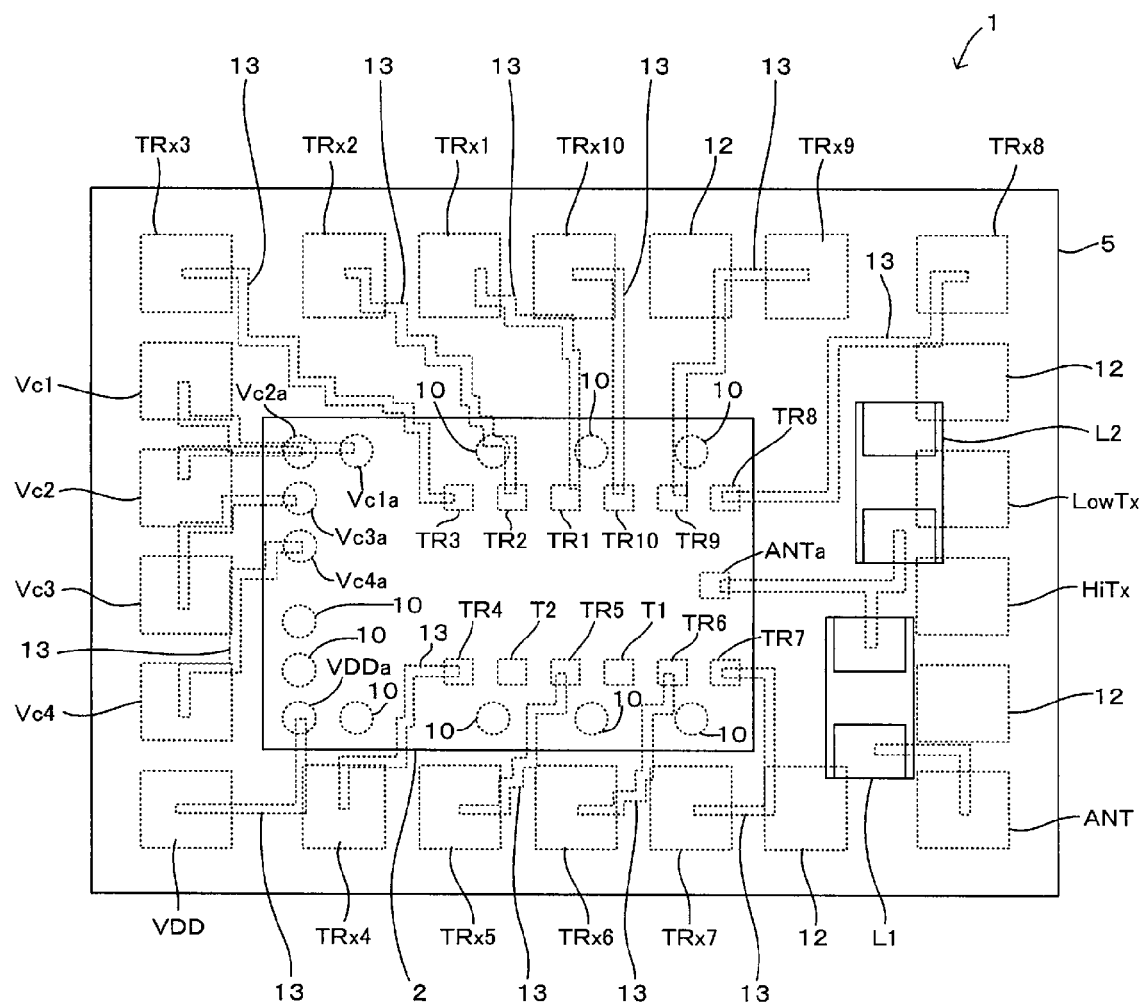
FIG. 6 is a plan view of the switch module illustrated in FIG. 1.

A switch module according to a preferred embodiment of the present invention will be described with reference to FIG. 1 to FIG. 6. FIG. 1 is a front view of the switch module according to a preferred embodiment of the present invention, FIG. 2 is a circuit configuration diagram of the switch module illustrated in FIG. 1, FIG. 3 is a terminal arrangement diagram of a switch IC, FIG. 4 is a plan view of the wiring substrate of a switch module 1, FIG. 5 is an arrangement diagram of mounting electrodes 4, and FIG. 6 is a plan view of the switch module 1 illustrated in FIG. 1. Note that in FIG. 1, the illustration of the sealing resin at a front portion is omitted.

The switch module 1 according to the present preferred embodiment preferably is a multi-band supporting module mounted in, for example, a cellular phone which can transmit and receive signals in a plurality of frequency bands. The switch module 1 functions to supply, through switching using a switch circuit, signals in a plurality of frequency bands received from a common antenna to signal paths corresponding to the respective frequency bands and to supply transmission signals input from a mother board to the common antenna for each of the frequency bands. Referring to FIG. 1, the switch module 1 includes a switch IC 2 which preferably has a rectangular or substantially rectangular shape in plan view and which includes a switch circuit provided on the active surface thereof, a chip component 3 including an impedance matching circuit and various other suitable circuits, a wiring substrate 5 having a rectangular or substantially rectangular shape in plan view and on one main surface of which a plurality of mounting electrodes 4 to be connected to a mother board (the outside) are provided, and a resin seal 6 which covers the switch IC 2 and the chip component 3 mounted on the other main surface of the wiring substrate 5.

Referring to FIG. 2, the circuits provided on the switch module 1 include a switch circuit provided in the switch IC 2, a matching circuit 8 which performs impedance matching between the switch IC 2 and a common antenna 7 provided outside of the switch module 1, low pass filters (LPFs) 9a and 9b arranged to attenuate the second and third harmonics of a transmission signal input from a power amplifier which is provided on the mother board or other suitable circuit elements.

Referring to FIG. 2, the switch IC 2 includes an antenna common terminal ANTa connected to the common antenna 7, ten transmission/reception common terminals TR1, TR2, TR3, TR4, TR5, TR6, TR7, TR8, TR9, and TR10 which are provided for respective frequency bands and are selectively connected through switching to the antenna common terminal ANTa, two transmission terminals T1 and T2 also selectively connected through switching to the antenna common terminal ANTa, four control terminals Vc1a, Vc2a, Vc3a, and Vc4a arranged to allow input of control signals, and a power supply terminal VDDa for power supply. The switch IC 2 selectively connects the antenna common terminal ANTa to the transmission/reception common terminals TR1, TR2, TR3, TR4, TR5, TR6, TR7, TR8, TR9, and TR10 and to the transmission terminals T1 and T2 based on the control signals input to the control terminals Vc1a, Vc2a, Vc3a, and Vc4a.

In the present preferred embodiment, a signal in the high-band side (e.g., 1800 MHz to 1900 MHz) frequency band is input at the transmission terminal T1, and a signal in the low-band side (e.g., 850 MHZ to 900 MHz) frequency band is input at the transmission terminal T2. Note that the transmission/reception common terminals TR1, TR2, TR3, TR4, TR5, TR6, TR7, TR8, TR9, and TR10 and the transmission terminals T1 and T2 correspond to RF signal terminals of preferred embodiments of the present invention. Hereinafter, in some cases, the transmission/reception common terminals TR1, TR2, TR3, TR4, TR5, TR6, TR7, TR8, TR9, and TR10 and the transmission terminals T1 and T2 are commonly referred to as RF signal terminals TRt, and the control terminals Vc1a, Vc2a, Vc3a, and Vc4a are commonly referred to as control terminals Vct.

On the one main surface of the wiring substrate 5, ten transmission/reception common electrodes TRx1, TRx2, TRx3, TRx4, TRx5, TRx6, TRx7, TRx8, TRx9, and TRx10 corresponding to the respective signal terminals TRt, two transmission electrodes HiTX and LowTx, four control electrodes Vc1, Vc2, Vc3, and Vc4 corresponding to the respective control terminals Vct, a power supply electrode VDD corresponding to the power supply terminal VDDa, and a common electrode ANT corresponding to the antenna common terminal ANTa are provided as the plurality of the mounting electrodes 4. The respective mounting electrodes 4 are connected to the corresponding RF signal terminals TRt, Vct, VDDa, and ANTa through wiring electrodes 13 and via conductors for interlayer connection provided in the wiring substrate 5.

Note that the transmission/reception common electrodes TRx1, TRx2, TRx3, TRx4, TRx5, TRx6, TRx7, TRx8, TRx9, and TRx10 and the transmission electrodes HiTX and LowTx correspond to the RF signal electrodes of preferred embodiments of the present invention. Hereinafter, in some cases, the transmission/reception common electrodes TRx1, TRx2, TRx3, TRx4, TRx5, TRx6, TRx7, TRx8, TRx9, and TRx10, and the transmission electrodes HiTX and LowTx are commonly referred to as RF signal electrodes TRd. Similarly, the control electrodes Vc1, Vc2, Vc3, and Vc4 are commonly referred to as control electrodes Vcd in some cases.

Referring to FIG. 2, the LPF 9a includes capacitors DCc1 and DCu2 and inductors DLt1 and DLt2, and the transmission terminal T1 is connected to the transmission electrode HiTX through the LPF 9a. The LPF 9b includes capacitors GCc1, GCc2, GCu1, and GCu2 and inductors GLt1 and GLt2, and the transmission terminal T2 is connected to the transmission electrode LowTx through the LPF 9b. The matching circuit 8 includes chip inductors L1 and L2 and a capacitor $C_{ANT}$, and the antenna common terminal ANTa is connected to the common electrode ANT through the matching circuit 8. Note that the chip inductors L1 and L2 are mounted on the other main surface of the wiring substrate 5.

The wiring substrate 5 is preferably made of, for example, a glass epoxy resin multilayer substrate or low-temperature simultaneously sintered ceramic multilayer substrate (LTCC substrate). For example, when the wiring substrate 5 is an LTCC multilayer substrate, the wiring substrate 5 is manufactured as follows. First, a green ceramic sheet is formed by making a sheet of slurry which is preferably made of a mixture of, for example, alumina and glass powder mixed together with an organic binder and a solvent. Then via holes are formed in the ceramic green sheet at predetermined positions by laser processing. The formed via holes are filled with conductive paste preferably including Ag, Cu, or other suitable material, for example, such that via conductors for interlayer connection are formed. Various electrode patterns are formed by printing conductive paste, for example. Then, a plurality of ceramic green sheets are stacked and pressed so as to form a ceramic multilayer body. The ceramic multilayer body is subjected to low-temperature sintering, e.g., sintered at a low temperature of about 1000° C.

Referring to FIG. 3, the terminals TRt, Vct, VDDa, and ANTa of the switch IC 2 are arranged such that, in plan view, the power supply terminal VDDa and the control terminals Vc2a, Vc3a, and Vc4a are arranged along one side of the switch IC 2 and the RF signal terminals TRt and the antenna common terminal ANTa are arranged along the other sides of the switch IC 2. Ground terminals 10 are preferably arranged in portions outside of the RF signal terminals TRt and between the power supply terminal VDDa and the control terminal Vc4a, for example.

Referring to FIG. 4, on the other main surface of the wiring substrate 5, connection electrodes 11a to connect the switch IC 2 to the wiring substrate 5 are provided at positions corresponding to the terminals TRt, Vct, VDDa, and ANTa and the ground terminals 10 of the switch IC 2 described above, and connection electrodes 11b to connect the chip inductors L1 and L2 to the wiring substrate 5 are provided. The respective connection electrodes 11a are connected to the terminals TRt, Vct, VDDa, and ANTa and the ground terminals 10 of the switch IC 2 preferably by solder, for example, and the chip inductors L1 and L2 are connected to the respective connection electrodes 11b preferably by solder, for example.

Referring to FIG. 5, the mounting electrodes 4 are provided in the peripheral portion of the one main surface of the wiring substrate 5, and a ground electrode 12 surrounded by the mounting electrodes 4 is provided on the one main surface. Some ground electrodes 12 are preferably provided in the peripheral portion of the one main surface of the wiring substrate 5.

The transmission/reception common electrodes TRx4, TRx5, TRx6, and TRx7 are arranged along one side of the wiring substrate 5, and the transmission/reception common electrodes TRx1, TRx2, TRx3, TRx8, TRx9, and TRx10 are arranged along a side facing the one side. The control electrodes Vc1, Vc2, Vc3, and Vc4, the power supply electrode VDD, and other suitable electrodes are arranged along sides other than the above-described two sides.

In this preferred embodiment, the frequency bands of RF signals flowing through the transmission/reception common electrode TRx3 are preferably 1920 MHz to 1980 MHz on the transmission side and 2110 MHz to 2170 MHz on the reception side, for example. The frequency bands of RF signals flowing through the transmission/reception common electrode TRx7 are preferably 1850 MHz to 1910 MHz on the transmission side and 1930 MHz to 1990 MHz on the reception side, for example. The transmission side frequency band of the transmission/reception common electrode TRx3 partially overlaps the reception side frequency band of the transmission/reception common electrode TRx7 and, thus, the transmission/reception common electrode TRx3 and the transmission/reception common electrode TRx7 are arranged respectively on the two opposing sides of the wiring substrate 5 so as to be separated from each other. In other words, among the transmission/reception common electrodes TRx3 and TRx7 used for input or output of two different RF signals respectively in partially overlapping frequency bands, the transmission/reception common electrode TRx3 for one signal is arranged on a side of the wiring substrate 5 opposite the side of the wiring substrate 5 on which the transmission/reception common electrode TRx7 for the other signal is arranged.

Referring to FIG. 6, the mounting electrodes 4 are preferably connected to the corresponding terminals Trt, Vct, VDDa, and ANTa of the switch IC 2 through the wiring electrodes 13, via conductors (not illustrated), the connection electrodes 11a, and solder (not illustrated) provided within the wiring substrate 5. For example, the transmission/reception common electrode TRx3 is preferably connected to the transmission/reception common terminal TR3 through a wiring electrode 13, a via conductor, a connection electrode 11a, and solder.

Referring to FIG. 6, the mounting electrodes 4 are arranged so as to be close to the corresponding terminals Trt, Vct, VDDa, ANTa, and the ground terminals 10 of the switch IC 2. Further, the wiring electrodes 13 are arranged in the wiring substrate 5 such that the wiring electrodes 13 respectively connecting the RF signal terminals TRt to the corresponding RF signal electrodes TRd are arranged so as not to overlap the wiring electrode 13 connecting the power supply terminal VDDa to the power supply electrode VDD and the wiring electrodes 13 respectively connecting the control terminals Vct to the corresponding control electrodes Vcd in plan view.

Thus, according to the present preferred embodiment, among the transmission/reception common electrodes TRx3 and TRx7 used for input or output of two different RF signals in partially overlapping respective frequency bands, the transmission/reception common electrode TRx3 for one signal is arranged on a side opposite to the side on which the transmission/reception common electrode TRx7 for the other signal is arranged so as to increase the distance between the transmission/reception common electrodes TRx3 and TRx7 which are likely to be influenced by the mutual interference between the signals. Thus, isolation characteristics of the transmission/reception common electrodes TRx3 and TRx7 are improved.

Since a ground electrode need not be arranged between the transmission/reception common electrodes TRx3 and TRx7 in order to improve the isolation characteristics of the transmission/reception common electrodes TRx3 and TRx7, the number of the mounting electrodes 4 to be provided on the one main surface of the wiring substrate 5 is decreased, such that the size of the switch module 1 is reduced.

In this preferred embodiment, since there is no need to provide transmission electrodes and reception electrodes separately as a result of providing the transmission/reception common electrodes TRx1, TRx2, TRx3, TRx4, TRx5, TRx6, TRx7, TRx8, TRx9, and TRx10, the number of the mounting electrodes 4 to be provided on the one main surface of the wiring substrate 5 is decreased, such that the size of the switch module 1 is further reduced.

Since the wiring electrodes 13 respectively connecting the RF signal terminals TRt to the corresponding RF signal electrodes TRd are arranged in the wiring substrate 5 so as to not overlap the wiring electrode 13 respectively connecting the power supply terminal VDDa to the corresponding power supply electrode VDD and the wiring electrodes 13 respectively connecting the control terminals Vct to the corresponding control electrodes Vcd in plan view, it is possible to significantly reduce or prevent noise caused by, for example, electromagnetic coupling which is generated between the wiring electrodes 13 respectively connecting the RF signal terminals TRt to the corresponding RF signal electrodes TRd and the wiring electrode 13 connecting the power supply terminal VDDa to the power supply electrode VDD and between the wiring electrodes 13 respectively connecting the RF signal terminals TRt to the corresponding RF signal electrodes TRd and the wiring electrodes 13 respectively connecting the control terminals Vct to the corresponding control electrodes Vcd. As a result, the switch IC 2 is prevented from malfunctioning due to noise.

Further, since the lengths of the wiring electrodes 13 respectively connecting the RF signal terminals TRt to the corresponding RF signal electrodes TRd are reduced as a result of arranging the RF signal terminals TRt close to the corresponding RF signal electrodes TRd, stray capacitance of the wiring electrodes 13 is reduced and degradation of the high-frequency characteristics of the switch module 1 is prevented.

Figure 7:
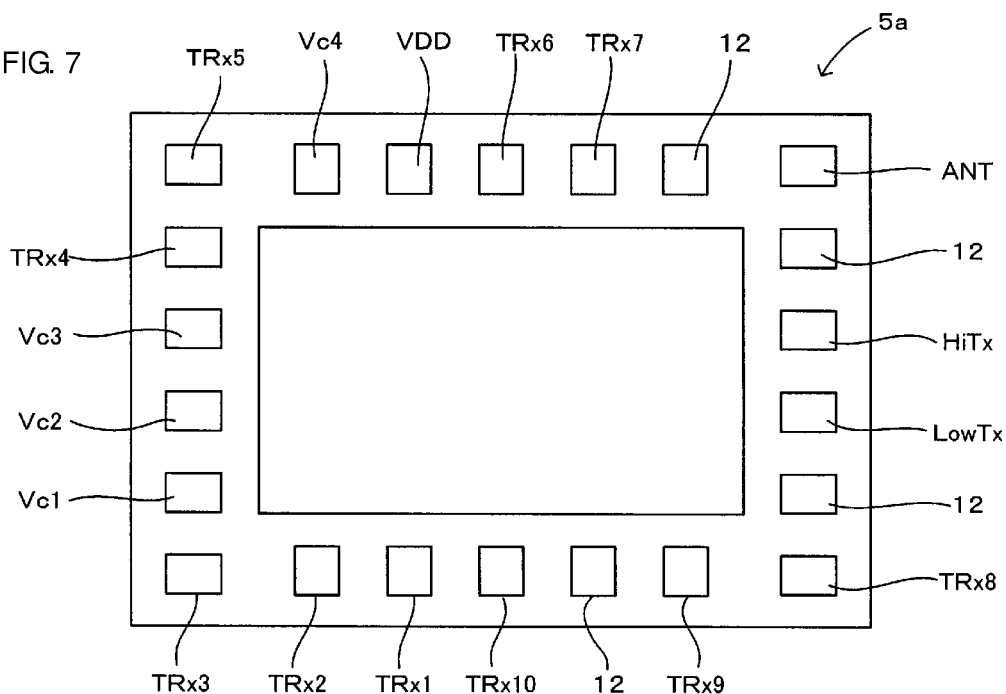
FIG. 7 is a diagram illustrating a modification of the wiring substrate illustrated in FIG. 1.
Figure 8:
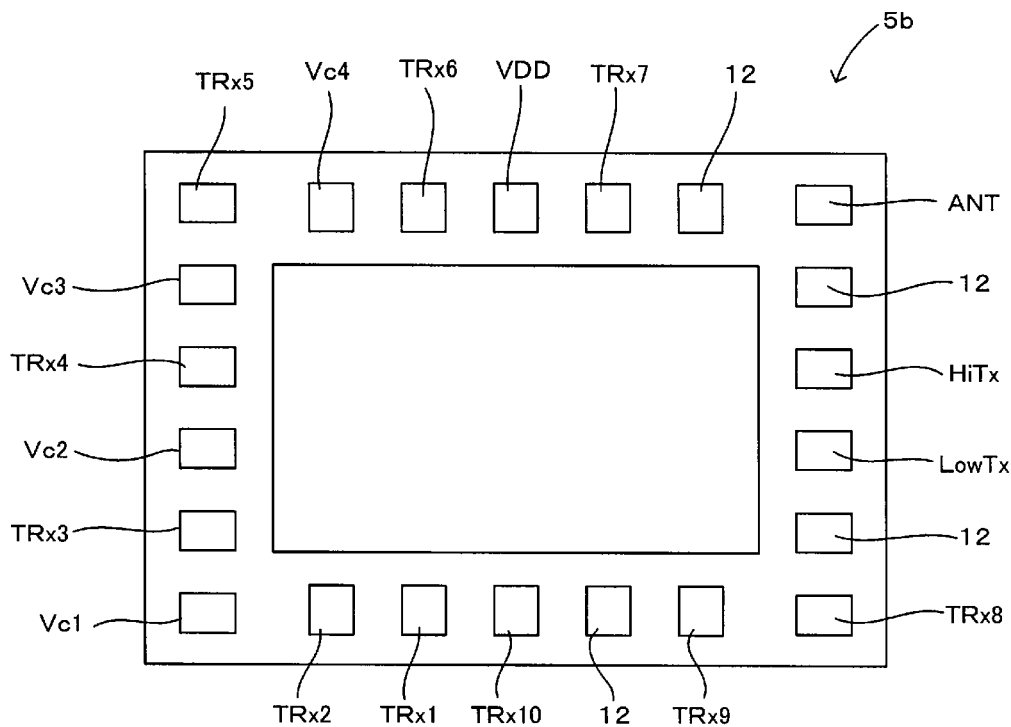
FIG. 8 is a diagram illustrating a modification of the wiring substrate illustrated in FIG. 1.
Figure 9:
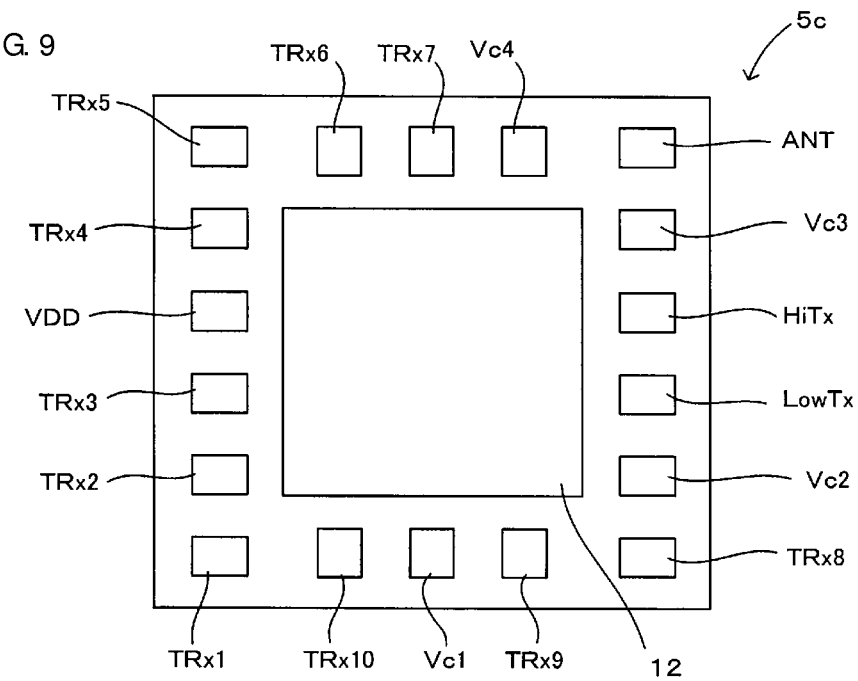
FIG. 9 is a diagram illustrating a modification of the wiring substrate illustrated in FIG. 1.
Figure 10:
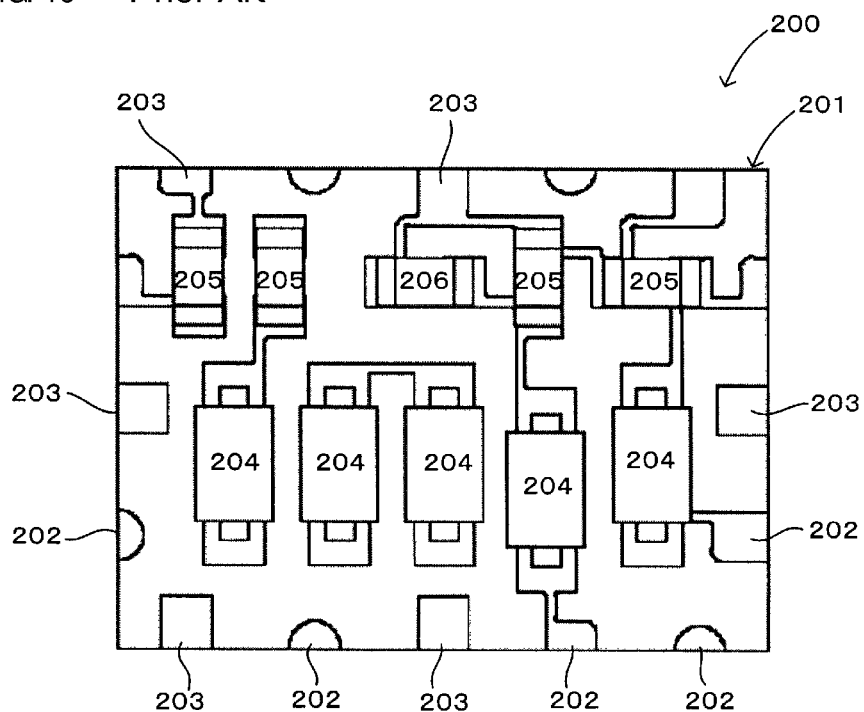
FIG. 10 is a plan view of a known switch module.

Modifications of the wiring substrate 5 of the switch module 1 according to the preferred embodiment described above, will be described with reference to FIG. 7 to FIG. 9. FIG. 7 to FIG. 9 respectively illustrate the bottom views of wiring substrates 5a, 5b, and 5c according to the modifications. In FIG. 7 to FIG. 9, portions denoted by the same reference symbols as those in FIG. 5 preferably are the same or substantially the same as those in FIG. 5, and the descriptions thereof are omitted.

Unlike the wiring substrate 5 described with reference to FIG. 5, in a wiring substrate 5a described in FIG. 7, the power supply electrode VDD and the control electrode Vc4 are arranged between the transmission/reception common electrode TRx5 and the transmission/reception common electrode TRx6 provided along the same side of the wiring substrate 5a.

By arranging the power supply electrode VDD and the control electrode Vc4 between the transmission/reception common electrodes TRx5 and TRx6 in this manner, even when the transmission/reception common electrodes TRx5 and TRx6 are arranged along the same side, the distance between the transmission/reception common electrodes TRx5 and TRx6 is increased and, thus, isolation characteristics of the transmission/reception common electrodes TRx5 and TRx6 are improved. Note that since signals respectively flowing through the control electrode Vcd and the power supply electrode VDD are DC currents, even when RF signals leak from the transmission/reception common electrodes TRx5 and TRx6, their influence is very small and negligible.

Further, since a separate ground electrode need not be provided to improve the isolation characteristics, the number of the mounting electrodes 4 provided on the wiring substrate 5a and, thus, the size of the switch module 1 is reduced.

Referring to FIG. 8, a configuration may preferably be provided in which the RF signal electrodes TRd are arranged on both sides of the power supply electrode VDD and on both sides of the control electrodes Vcd. With this configuration, in one main surface of a wiring substrate 5b, the power supply electrode VDD and/or the control electrodes Vcd are effectively arranged between the RF signal electrodes TRd and, thus, isolation characteristics of the RF signal electrodes TRd are improved.

Referring to FIG. 9, the ground electrodes 12 provided on the peripheral portions of the wiring substrate 5 may preferably be arranged so as to be integrated into the ground electrode 12 arranged in an area surrounded by the mounting electrodes 4. With this configuration, the number of the electrodes 4 and 12 provided on one main surface of a wiring substrate 5C is decreased and, thus, the size of the switch module 1 is further reduced.

The present invention is not limited to the preferred embodiments described above, and various modifications other than those described above are possible within the scope of the present invention.

For example, in FIG. 7, although the power supply electrode VDD and the control electrode Vc4 are preferably arranged between the transmission/reception common electrode TRx5 and the transmission/reception common electrode TRx6, only one of the power supply electrode VDD and the control electrodes Vcd may be arranged between the transmission/reception common electrodes TRx5 and TRx6. With this configuration, as compared to the case in which the transmission/reception common electrodes TRx5 and TRx6 are arranged next to each other, isolation characteristics of the transmission/reception common electrodes TRx5 and TRx6 are improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A switch module comprising:
   an antenna common terminal;
   a plurality of RF signal terminals;
   a control terminal;
   a power supply terminal;
   a switch circuit selectively connecting, through switching, one of the plurality of RF signal terminals to the antenna common terminal based on a control signal input to the control terminal; and
   a wiring substrate on which the switch circuit is provided; wherein
   the wiring substrate includes a plurality of mounting electrodes for external connection provided on a peripheral portion of one main surface of the wiring substrate;
   the switch circuit is provided on another main surface of the wiring substrate opposite to the one main surface of the wiring substrate;
   the plurality of mounting electrodes includes:
     a common electrode connected to the antenna common terminal;
     a plurality of RF signal electrodes respectively connected to the plurality of RF signal terminals;
     a control electrode connected to the control terminal; and
     a power supply electrode connected to the power supply terminal;
   at least one of the power supply electrode and the control electrode is arranged between electrodes of the plurality of RF signal electrodes that input or output RF signals whose frequency bands partially overlap one another;
   the wiring substrate is rectangular or substantially rectangular in plan view;
   among the plurality of the RF signal electrodes that are arranged to input or output two RF signals whose frequency bands partially overlap one another, the RF signal electrode arranged to input or output one of the two RF signals is arranged on a side of the wiring substrate opposite a side of the wiring substrate on which the RF signal electrode arranged to input or output the other RF signal is arranged;
   the power supply electrode and the control electrode are arranged on sides of the wiring substrate excluding the sides of the wiring substrate on which the RF signal electrodes arranged to input or output the two RF signals are respectively arranged; and
   the plurality of RF signal electrodes, the power supply electrode, and the control electrode are arranged on the wiring substrate to reduce or prevent mutual signal interference between the RF signal electrodes arranged to input or output RF signals.

2. The switch module according to claim 1, wherein the plurality of RF signal electrodes include a transmission/reception common electrode.

3. The switch module according to claim 1, further comprising:
   a ground electrode provided on the one main surface; wherein
   the ground electrode is arranged in an area of the one main surface surrounded by the plurality of mounting electrodes.

4. The switch module according to claim 1, wherein wiring electrodes respectively connecting the plurality of RF signal terminals to the plurality of RF signal electrodes, a wiring electrode connecting the power supply terminal to the power supply electrode, and a wiring electrode connecting the control terminal to the control electrode are arranged on the wiring substrate so as not to overlap one another.

5. The switch module according to claim 1, wherein the plurality of RF signal electrodes are arranged on both sides of the power supply electrode and on both sides of the control electrode.

6. The switch module according to claim 1, wherein
the switch circuit is a rectangular or a substantially rectangular switch IC in plan view mounted on the another main surface of the wiring substrate;
the power supply terminal and the control terminal are arranged along one side of the switch IC in plan view;
the plurality of RF signal terminals are arranged along sides of the switch IC other than the one side of the switch IC in plan view;
the power supply electrode and the control electrode are respectively arranged close to the power supply terminal and the control terminal; and
the plurality of RF signal electrodes are arranged close to the RF signal terminal.

7. The switch module according to claim 1, further comprising:
a chip component including an impedance matching circuit provided on the another main surface of the wiring substrate opposite to the one main surface of the wiring substrate.

8. The switch module according to claim 1, wherein the wiring substrate is defined by a multilayer substrate made of a glass epoxy resin.

9. The switch module according to claim 1, wherein the wiring substrate is defined by a multilayer substrate made of a low-temperature sintered ceramic material.

10. The switch module according to claim 1, wherein all of the plurality of mounting electrodes are arranged in a peripheral portion of the one main surface of the wiring substrate.

11. The switch module according to claim 10, further comprising a ground electrode disposed in a central portion of the one main surface of the wiring substrate surrounded by the peripheral portion of the one main surface of wiring substrate.

12. The switch module according to claim 11, further comprising additional ground electrodes disposed in the peripheral portion of the one main surface of the wiring substrate.

13. The switch module according to claim 1, wherein
the plurality of RF signal electrodes are disposed along two opposed sides of the one main surface of the wiring substrate; and
the control electrode and the power supply electrode are disposed along at least one side of the one main surface of the wiring substrate other than the two opposed sides of the one main surface of the wiring substrate.

14. The switch module according to claim 1, wherein
the plurality of RF signal electrodes, the control electrode, and the power supply electrode are all disposed along two opposed sides of the one main surface of the wiring substrate; and
the control electrode and the power supply electrode are arranged directly adjacent to one another along one of the two opposed sides of the one main surface of the wiring substrate.

15. The switch module according to claim 1, wherein
the plurality of RF signal electrodes, the control electrode, and the power supply electrode are disposed along two opposed sides of the one main surface of the wiring substrate; and
the control electrode and the power supply electrode are arranged along one of the two opposed sides of the one main surface of the wiring substrate and spaced apart from one another with at least one of the plurality of RF signal electrodes disposed therebetween.

* * * * *